(12) United States Patent
Miyahara

(10) Patent No.: US 10,707,860 B1
(45) Date of Patent: Jul. 7, 2020

(54) SEMICONDUCTOR DEVICE CAPABLE OF REDUCING A TEMPERATURE DIFFERENCE AMONG SEMICONDUCTOR CHIPS

(71) Applicant: Mitsubishi Electric Corporation, Tokyo (JP)

(72) Inventor: Satoshi Miyahara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/513,495

(22) Filed: Jul. 16, 2019

(30) Foreign Application Priority Data

Dec. 20, 2018 (JP) ................................. 2018-238705

(51) Int. Cl.
| | | |
|---|---|---|
| *H03K 17/00* | (2006.01) | |
| *H03K 17/56* | (2006.01) | |
| *H03K 17/62* | (2006.01) | |
| *H03K 17/14* | (2006.01) | |
| *H03K 17/567* | (2006.01) | |
| *H03K 17/60* | (2006.01) | |
| *H03K 17/76* | (2006.01) | |

(52) U.S. Cl.
CPC ........... *H03K 17/14* (2013.01); *H03K 17/567* (2013.01); *H03K 17/603* (2013.01); *H03K 17/6257* (2013.01); *H03K 17/76* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,356,408 A * | 10/1982 | Glennon | .......... | H03K 17/04126 327/405 |
| 4,616,142 A * | 10/1986 | Upadhyay | .............. | H03K 17/12 323/272 |
| 6,323,717 B1 * | 11/2001 | Omura | ................... | H03K 17/12 327/434 |
| 6,353,309 B1 * | 3/2002 | Ootani | ................. | H03K 17/122 323/282 |

FOREIGN PATENT DOCUMENTS

JP  2016-127435 A  7/2016

* cited by examiner

*Primary Examiner* — An T Luu
(74) *Attorney, Agent, or Firm* — Studebaker & Brackett PC

(57) ABSTRACT

A semiconductor device including a first semiconductor chip, a second semiconductor chip, the junction temperature of which becomes higher than that of the first semiconductor chip during switching of the semiconductor device, a collector pattern electrically connected to a collector of the first semiconductor chip and a collector of the second semiconductor chip, an emitter pattern electrically connected to an emitter of the first semiconductor chip and an emitter of the second semiconductor chip, a gate pattern electrically connected to a gate of the first semiconductor chip, a first diode having an anode electrically connected to the gate pattern and a cathode electrically connected to a gate of the second semiconductor chip and a second diode connected in reverse parallel with the first diode.

17 Claims, 6 Drawing Sheets

SEMICONDUCTOR DEVICE CAPABLE OF REDUCING A TEMPERATURE DIFFERENCE AMONG SEMICONDUCTOR CHIPS

BACKGROUND OF THE INVENTION

Field

The present invention relates to a semiconductor device.

Background

The power module according to Japanese Patent Application Laid-open No. 2016-127435 has two IGBTs connected in parallel with each other. A gate resistance adjusting circuit increases the gate resistance of a first IGBT chip when the temperature of the first IGBT chip exceeds the temperature of a second IGBT chip. When the temperature of the first IGBT chip falls below the temperature of the second IGBT chip, the gate resistance adjusting circuit decreases the gate resistance of the first IGBT chip.

Some semiconductor devices are configured by connecting a plurality of power chips in parallel. In such a semiconductor device, the operating temperature limits of the semiconductor device may be determined by only one chip having the highest junction temperature.

According to Japanese Patent Application Laid-open No. 2016-127435, the temperature difference among the chips is reduced by adjusting the gate resistance. Generally, the switching loss varies as the gate resistance is adjusted, while the steady loss remains unchanged. When the power chip has a low operating frequency, the proportion of the switching loss to the power loss tends to be generally small. Therefore, the range of temperatures that can be evened out by adjustment of the gate resistance may be limited.

SUMMARY

The present invention was made to solve the problem described above and it is an object of the invention to provide a semiconductor device that can reduce the temperature difference among semiconductor chips.

The features and advantages of the present invention may be summarized as follows.

According to the present invention, a semiconductor device includes a first semiconductor chip, a second semiconductor chip, the junction temperature of which becomes higher than that of the first semiconductor chip during switching of the semiconductor device, a collector pattern electrically connected to a collector of the first semiconductor chip and a collector of the second semiconductor chip, an emitter pattern electrically connected to an emitter of the first semiconductor chip and an emitter of the second semiconductor chip, a gate pattern electrically connected to a gate of the first semiconductor chip, a first diode having an anode electrically connected to the gate pattern and a cathode electrically connected to a gate of the second semiconductor chip and a second diode connected in reverse parallel with the first diode.

According to the present invention, a semiconductor device includes a first semiconductor chip, a second semiconductor chip a third semiconductor chip, a collector pattern electrically connected to a collector of the first semiconductor chip, a collector of the second semiconductor chip, and a collector of the third semiconductor chip, an emitter pattern electrically connected to an emitter of the first semiconductor chip, an emitter of the second semiconductor chip, and an emitter of the third semiconductor chip, a gate pattern electrically connected to a gate of the first semiconductor chip and a gate of the third semiconductor chip, a first diode having an anode electrically connected to the gate pattern and a cathode electrically connected to a gate of the second semiconductor chip and a second diode connected in reverse parallel with the first diode, wherein the second semiconductor chip is provided between the first semiconductor chip and the third semiconductor chip.

Other and further objects, features and advantages of the invention will appear more fully from the following description.

DESCRIPTION OF EMBODIMENTS

Figure 1:
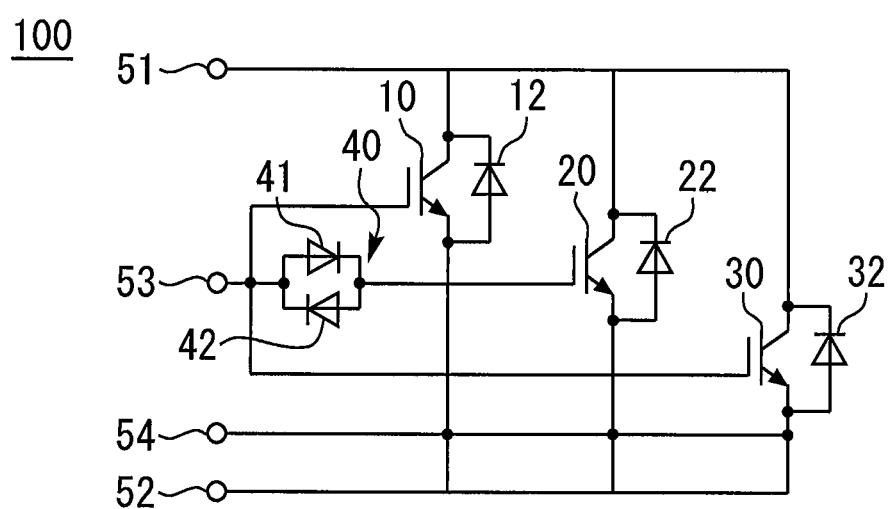
FIG. 1 is a circuit diagram of a semiconductor device according to a first embodiment.

A semiconductor device according to an embodiment of the present invention will be described with reference to the accompanying drawings. Components identical or corresponding to each other are indicated by the same reference characters, and repeated description of them is avoided in some cases.

First Embodiment

FIG. 1 is a circuit diagram of a semiconductor device 100 according to a first embodiment. The semiconductor device 100 includes a first semiconductor chip 10, a second semiconductor chip 20, and a third semiconductor chip 30, connected in parallel with each other. The first semiconductor chip 10, second semiconductor chip 20, and third semiconductor chip 30 are power semiconductor chips such as insulated gate bipolar transistors (IGBTs), for example.

The cathode of a diode 12 is connected to the collector of the first semiconductor chip 10. The anode of the diode 12 is connected to the emitter of the first semiconductor chip 10. The cathode of a diode 22 is connected to the collector of the second semiconductor chip 20. The anode of the diode 22 is connected to the emitter of the second semiconductor chip 20. The cathode of a diode 32 is connected to the collector of the third semiconductor chip 30. The anode of the diode 32 is connected to the emitter of the third semiconductor chip 30. The diodes 12, 22, and 32 are free wheeling diodes (FWDs).

The semiconductor device 100 has three IGBT chips and three FWDs for forming one phase. This way, the current capacity per one phase can be increased. The IGBTs and FWDs may be provided on one chip.

The semiconductor device 100 includes a P terminal 51 electrically connected to the collectors of the first semiconductor chip 10, second semiconductor chip 20, and third semiconductor chip 30. The semiconductor device 100 also includes an N terminal 52 electrically connected to the emitters of the first semiconductor chip 10, second semiconductor chip 20, and third semiconductor chip 30. Further, the semiconductor device 100 includes a gate terminal 53 electrically connected to the gates of the first semiconductor chip 10 and third semiconductor chip 30.

The gate of the second semiconductor chip 20 is electrically connected to the gate terminal 53 via a gate voltage adjusting circuit 40. The gate voltage adjusting circuit 40 has a first diode 41 and a second diode 42 connected in reverse parallel. The anode of the first diode 41 is electrically connected to the gate terminal 53, and the cathode of the first diode 41 is electrically connected to the gate of the second semiconductor chip 20. The anode of the second diode 42 is electrically connected to the gate of the second semiconductor chip 20, and the cathode of the second diode 42 is electrically connected to the gate terminal 53.

The semiconductor device 100 includes an Es terminal 54. The Es terminal 54 is electrically connected to the emitters of the first semiconductor chip 10, second semiconductor chip 20, and third semiconductor chip 30.

Figure 2:
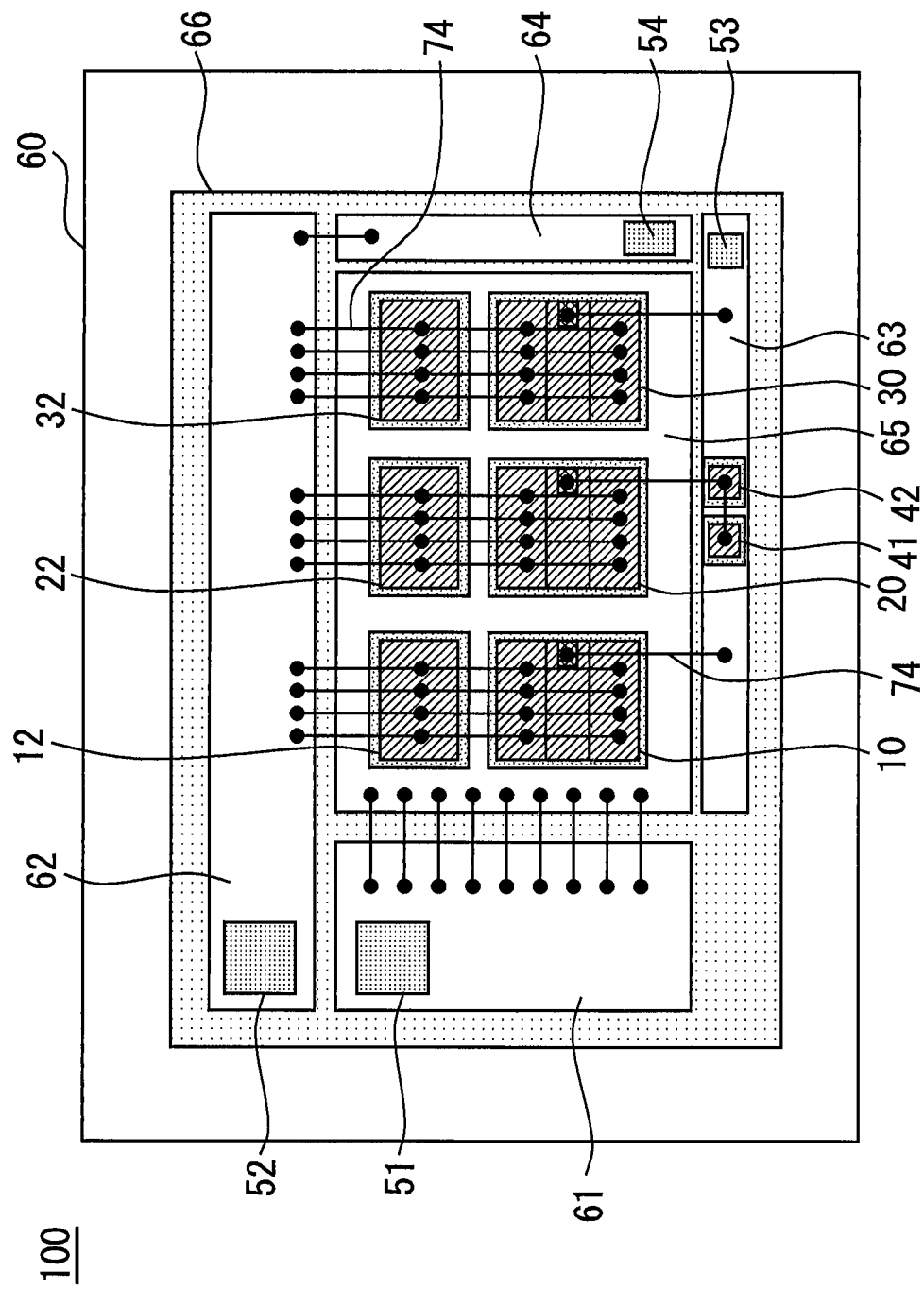
FIG. 2 is a plan view of the semiconductor device according to the first embodiment.

FIG. 2 is a plan view of the semiconductor device 100 according to the first embodiment. The semiconductor device 100 includes a base plate 60 and an insulating substrate 66 provided on the base plate 60. On the upper surface of the insulating substrate 66, a collector pattern 61, an emitter pattern 62, a gate pattern 63, an Es terminal pattern 64, and a chip mounting pattern 65 are provided.

The first semiconductor chip 10, second semiconductor chip 20, third semiconductor chip 30, and diodes 12, 22, and 32 are mounted on the upper surface of the chip mounting pattern 65. The first semiconductor chip 10, second semiconductor chip 20, and third semiconductor chip 30 are aligned on the insulating substrate 66. The second semiconductor chip 20 is provided between the first semiconductor chip 10 and the third semiconductor chip 30.

In each of the first semiconductor chip 10, second semiconductor chip 20, and third semiconductor chip 30, the emitter and the gate are provided on the upper surface, and the collector is provided on the back surface. In each of the diodes 12, 22, and 32, the anode is provided on the upper surface, and the cathode is provided on the back surface.

The collector pattern 61 is electrically connected to the chip mounting pattern 65 with bond wires 74. Thus the collector pattern 61 is electrically connected to the collectors of the first semiconductor chip 10, second semiconductor chip 20, and third semiconductor chip 30. The collector pattern 61 is also electrically connected to the cathodes of the diodes 12, 22, and 32. The P terminal 51 is provided on the upper surface of the collector pattern 61.

The emitter pattern 62 is electrically connected to the upper surfaces of the first semiconductor chip 10, second semiconductor chip 20, and third semiconductor chip 30 with bond wires 74. The upper surfaces of the first semiconductor chip 10, second semiconductor chip 20, and third semiconductor chip 30 are also electrically connected to the upper surfaces of the diodes 12, 22, and 32 with bond wires 74. Thus the emitter pattern 62 is electrically connected to the emitters of the first semiconductor chip 10, second semiconductor chip 20, and third semiconductor chip 30. The emitter pattern 62 is also electrically connected to the anodes of the diodes 12, 22, and 32. The N terminal 52 is provided on the upper surface of the emitter pattern 62.

The gate pattern 63 is electrically connected to gate pads provided on the upper surfaces of the first semiconductor chip 10 and third semiconductor chip 30 with bond wires 74. Thus the gate pattern 63 is electrically connected to the gates of the first semiconductor chip 10 and third semiconductor chip 30.

The first diode 41 and second diode 42 are mounted on the upper surface of the gate pattern 63. In the first diode 41, the cathode is provided on the upper surface, and the anode is provided on the back surface. In the second diode 42, the anode is provided on the upper surface, and the cathode is provided on the back surface. Thus, the anode of the first diode 41 is electrically connected to the gate pattern 63. The cathode of the second diode 42 is electrically connected to the gate pattern 63. The upper surface of the first diode 41 is electrically connected to the upper surface of the second diode 42 with bond wires 74. This way, the first diode 41 and second diode 42 are connected in reverse parallel.

The upper surface of the second diode 42 is electrically connected to the gate pad provided on the upper surface of the second semiconductor chip 20 with bond wires 74. Thus the anode of the second diode 42 is electrically connected to the gate of the second semiconductor chip 20. The cathode of the first diode 41 is electrically connected to the gate of the second semiconductor chip 20.

As described above, the gate terminal 53 of the semiconductor device 100 for controlling the driving of the semiconductor device 100 is connected to the gates of the three IGBT chips. Only the second semiconductor chip 20, of the first, second, and third semiconductor chips 10, 20, and 30, is provided with diodes connected in reverse parallel in the gate line.

Figure 3:
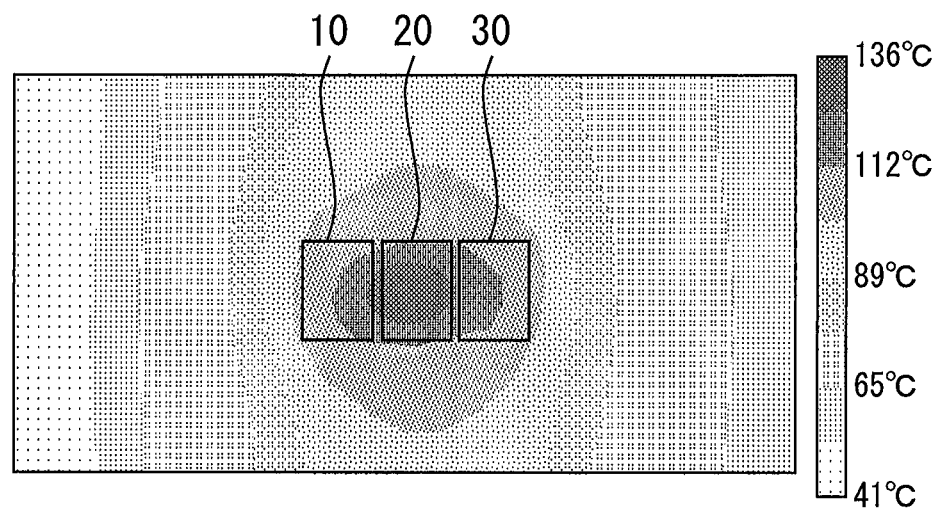
FIG. 3 is a diagram illustrating the junction temperatures of a semiconductor device according to a comparative example.

FIG. 3 is a diagram illustrating the junction temperatures of a semiconductor device 101 according to a comparative example. The semiconductor device 101 according to the comparative example is different from the semiconductor device 100 in that it does not include the first diode 41 and second diode 42. Generally, it is important to reduce the junction temperature of a power semiconductor chip. The semiconductor device 101 according to the comparative example has a first semiconductor chip 10, a second semiconductor chip 20, and a third semiconductor chip 30 connected in parallel and arranged closely together. Therefore, each semiconductor chip is prone to be affected by the heat of other semiconductor chips. The junction temperature of such thermally affected semiconductor chip becomes higher than the junction temperature of the heat of a single semiconductor chip.

Depending on the layout of the plurality of semiconductor chips, a particular semiconductor chip may be more susceptible to the effects of thermal interference. There may then be a large difference in junction temperature among the plurality of semiconductor chips that form one phase. In the semiconductor device 101 according to the comparative example, for example, the second semiconductor chip 20 positioned in the center is thermally affected by the first semiconductor chip 10 and third semiconductor chip 30 positioned on both sides. The second semiconductor chip 20 therefore will have the highest junction temperature. Consequently, the operating limit of the semiconductor device 101 may be determined by the second semiconductor chip 20 alone.

A possible solution is to optimize the gate drive voltage of each of the plurality of semiconductor chips discretely. The semiconductor device 101, however, is designed to drive one phase with one gate voltage, and not capable of setting a discrete gate drive voltage for each of the semiconductor chips.

Figure 4:
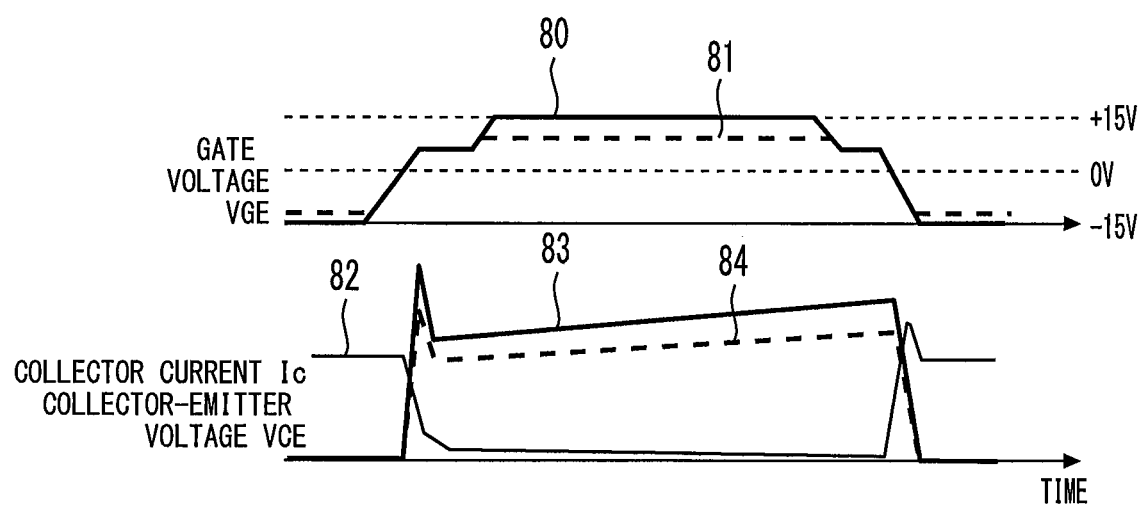
FIG. 4 is a diagram illustrating changes with time of gate voltage, collector current, and collector-emitter voltage.

Next, the operation of the semiconductor device 100 according to this embodiment will be described. FIG. 4 is a diagram illustrating changes with time of gate voltage, collector current, and collector-emitter voltage. FIG. 4 is a schematic illustration of behaviors of each semiconductor chip when turned on and turned off during an inductive load switching test. Solid line 80 represents the gate voltage of the first semiconductor chip 10 and third semiconductor chip 30, while broken line 81 represents the gate voltage of the second semiconductor chip 20. Solid line 82 represents the collector-emitter voltage. Solid line 83 represents the collector current of the first semiconductor chip 10 and third semiconductor chip 30, while broken line 84 represents the collector current of the second semiconductor chip 20. When the gate voltage is changed from −15 V to +15 V, the collector-emitter voltage of each semiconductor chip drops and a collector current starts to flow. At this time, the gate voltage applied to the second semiconductor chip 20 is lower than +15 V due to the voltage drop across the first diode 41. The gate voltage of the second semiconductor chip 20 is 12 V, for example.

The gate voltage of the second semiconductor chip 20 is reduced so that it is lower than that of the first semiconductor chip 10 and third semiconductor chip 30. Accordingly, because of the transmission characteristics of the IGBT, a smaller amount of collector current conducts to the second semiconductor chip 20 than that to the first semiconductor chip 10 and third semiconductor chip 30. The amount by which the collector current to the second semiconductor chip 20 is reduced is distributed to the first semiconductor chip 10 and third semiconductor chip 30.

When the gate voltage is changed from +15 V to −15 V, the collector-emitter voltage of each semiconductor chip increases so that the collector current stops to flow. At this time, the gate voltage applied to the second semiconductor chip 20 is a voltage obtained by subtracting the voltage drop across the second diode 42 from −15V. The gate voltage of the second semiconductor chip 20 is −12 V, for example.

Figure 5:
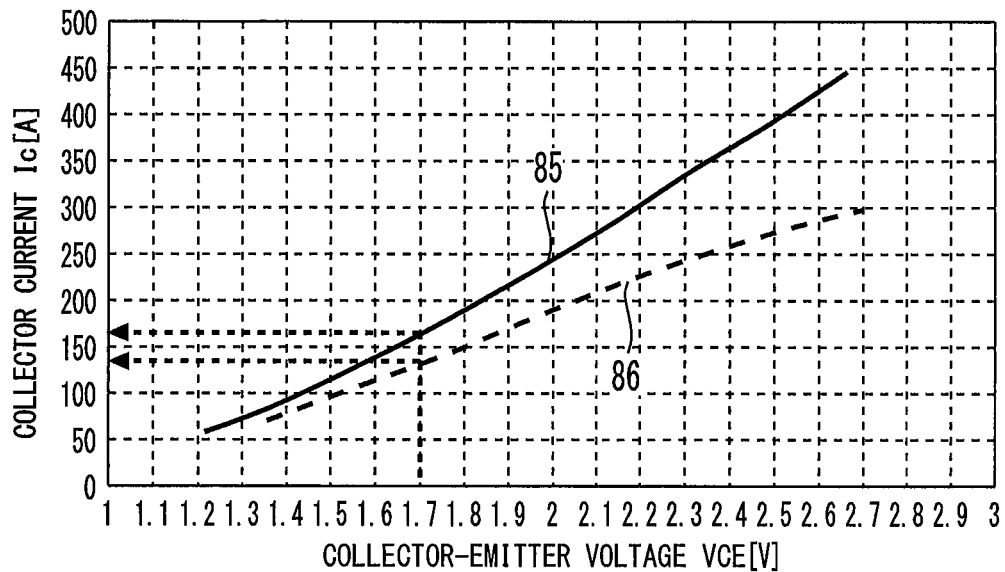
FIG. 5 is a diagram illustrating the transmission characteristics of the first to third semiconductor chip.

FIG. 5 is a diagram illustrating the transmission characteristics of the first to third semiconductor chip 10, 20, and 30. Solid line 85 represents the transmission characteristics of the first semiconductor chip 10 and third semiconductor chip 30, while broken line 86 represents the transmission characteristics of the second semiconductor chip 20. The collector-emitter voltage of the first to third semiconductor chips 10, 20, and 30 connected in parallel is constant. Thus the collector current varies as the gate voltage changes. Consequently, the second semiconductor chip 20 has a smaller steady loss than that of the first semiconductor chip 10 and third semiconductor chip 30. Thus the temperature rise of the second semiconductor chip 20 by its own heat is suppressed.

Figure 6:
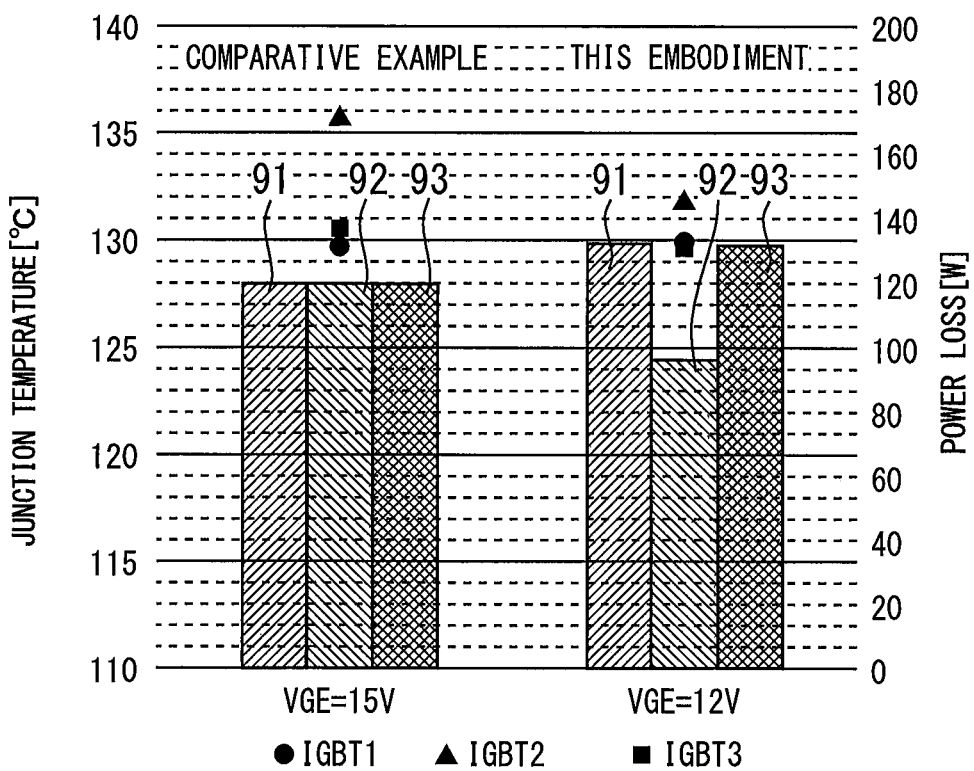
FIG. 6 is a diagram explaining the effects of the first embodiment.

FIG. 6 is a diagram explaining the effects of the first embodiment. FIG. 6 shows calculation results of power losses and temperature rises of the semiconductor chips in each of this embodiment and the comparative example. In FIG. 6, the junction temperature refers to a highest junction temperature in the chip surface. The power loss shown in FIG. 6 is also referred to as inverter loss.

In the comparative example, the collector current is uniform because the gate voltage is uniform among the first to third semiconductor chips 10, 20, and 30. Therefore the power losses 91, 92, and 93 of the first to third semiconductor chips 10, 20, and 30 are all the same. Accordingly, the second semiconductor chip 20 has a junction temperature that is higher by about 6K than that of the first semiconductor chip 10 and third semiconductor chip 30 because of the effects of thermal interference.

In this embodiment, on the other hand, the second semiconductor chip 20 has a lower gate voltage than that of the first semiconductor chip 10 and third semiconductor chip 30, so that a smaller collector current flows. Accordingly, the power loss 92 of the second semiconductor chip 20 is smaller than the power losses 91 and 93 of the first semiconductor chip 10 and third semiconductor chip 30. Thus the second semiconductor chip 20 has a junction temperature that is lower by about 4K than that of the comparative example. This way, the difference in junction temperature among semiconductor chips can be reduced in this embodiment.

In this embodiment, the gate voltage adjusting circuit 40 is provided to the second semiconductor chip 20 that tends to have a higher junction temperature than that of the first semiconductor chip 10 and third semiconductor chip 30 during the switching of the semiconductor device 100. The main current flowing through the semiconductor chip that has a highest junction temperature can thus be reduced. This way, the power loss of the semiconductor chip that has a highest junction temperature is reduced, whereby the junction temperature can be lowered. Thus the difference in junction temperature among semiconductor chips can be reduced.

Moreover, according to this embodiment, as compared to the comparative example, the maximum value of junction temperature can be lowered without changing the operating condition such as gate voltage input from outside. Further, there is no need to use a dedicated semiconductor device or a special control circuit that can drive the plurality of semiconductor chips individually from outside in order to set a gate drive voltage for each semiconductor chip. The configuration of the semiconductor device 100 can thus be prevented from becoming complex. Thus the semiconductor device 100 can have a simple configuration, and be produced at lower cost. Also, the control circuit for controlling the gate voltage can be standardized.

The first diode 41 and second diode 42 are mounted to the gate pattern 63. Therefore, the gate voltage adjusting circuit 40 can be provided to semiconductor devices that do not have a gate voltage adjusting circuit 40 without changing wire dimensions and pattern layouts.

Power loss could be reduced by adjusting the gate resistance. However, the power loss that can be reduced by adjustment of gate resistance is mostly switching loss. Therefore, when the switching frequency is low and the proportion of switching loss to the power loss is small, it could be difficult to control the temperature of the semiconductor device 100.

In this embodiment, the current flowing through the second semiconductor chip 20 can be reduced by adjusting the gate voltage. That is, the steady loss of the second semiconductor chip 20 can be reduced. Therefore, the junction temperature can be lowered sufficiently even when the switching frequency is low.

This embodiment is different from a configuration that is provided with a diode and a switching device as a bypass circuit for a resistor that adjusts gate resistance. In this embodiment, no resistor is connected between the anode and the cathode of the first diode 41 and between the anode and the cathode of the second diode 42. That is, no resistor is connected in parallel with the first diode 41 and second diode 42. No switching device is connected, either, between the first diode 41 and the second semiconductor chip 20 and between the first diode 41 and the gate pattern 63. That is, no switching device is connected in series with the first diode 41 or the second diode 42.

As a variation example of this embodiment, two or more semiconductor chips may be connected in parallel in the semiconductor device 100. While the gate voltage adjusting circuit 40 is connected to the second semiconductor chip 20 that is provided between the first semiconductor chip 10 and the third semiconductor chip 30 in this embodiment, this need not necessarily be so, and the gate voltage adjusting circuit 40 may be provided to one of the plurality of semiconductor chips most supplied with heat from its surroundings. Alternatively, the gate voltage adjusting circuit 40 may be provided to a semiconductor chip that will have the highest junction temperature when the plurality of semiconductor chips are switched with the same gate voltage.

Alternatively, the gate voltage adjusting circuit 40 may be provided to one of the plurality of semiconductor chips having characteristics that the junction temperature is most likely to rise. For example, the gate voltage adjusting circuit 40 may be provided to one of the plurality of semiconductor chips that has the lowest threshold voltage or collector-emitter saturation voltage.

If there are more than one semiconductor chips that are prone to have high junction temperature in the plurality of semiconductor chips, the gate voltage adjusting circuit 40 may be provided to each of the semiconductor chips that tend to have a high junction temperature. Namely, the semiconductor device 100 may be provided with a plurality of gate voltage adjusting circuits 40. In the gate voltage adjusting circuit 40, a plurality of first diodes 41 may be connected in series and a plurality of second diodes 42 may be connected in series. This way, the amount of voltage drop at the gate by the operation of the gate voltage adjusting circuit 40 can be made adjustable.

These modifications can be applied, as appropriate, to a semiconductor device according to the following embodiments. Note that the semiconductor device according to the following embodiments are similar to the semiconductor device of the first embodiment in many respects, and thus differences between the semiconductor device according to the following embodiments and the semiconductor device of the first embodiment will be mainly described below.

Second Embodiment

Figure 7:
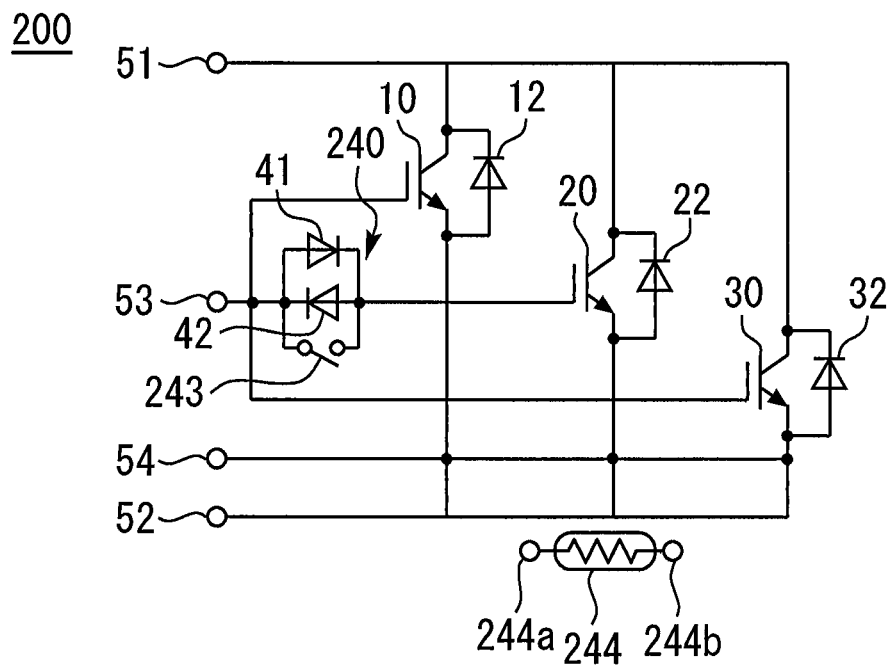
FIG. 7 is a circuit diagram of a semiconductor device according to a second embodiment.

FIG. 7 is a circuit diagram of a semiconductor device 200 according to a second embodiment. This semiconductor device 200 includes a gate voltage adjusting circuit 240. The gate voltage adjusting circuit 240 includes a switch 243 connected in parallel with the first diode 41 and second diode 42. The semiconductor device 200 also includes a thermistor 244 that detects the temperature of the semiconductor device 200. The resistance across the terminals 244a and 244b of the thermistor 244 lowers when the temperature rises. The switch 243 turns off when the temperature detected by the thermistor 244 exceeds a predetermined value.

When the semiconductor device 200 is at a low temperature and the switch 243 is the on state, the first diode 41 and second diode 42 are bypassed by the switch 243. In this state, the second semiconductor chip 20 is driven with the same gate voltage as that of the first semiconductor chip 10 and third semiconductor chip 30. The switch 243 turns off when the temperature detected by the thermistor 244 exceeds a predetermined value. When the switch 243 is off, the gate of the second semiconductor chip 20 is driven through the first diode 41 and second diode 42. Therefore, similar effects to those of the first embodiment are achieved.

As described in the first embodiment, the junction temperature of the second semiconductor chip 20 can be reduced by driving the gate through the first diode 41 and second diode 42. On the other hand, the power losses of the first semiconductor chip 10 and third semiconductor chip 30 increase. The sum of the power losses of one phase may end up being higher.

In this embodiment, however, the switch 243 is turned on and off based on the temperature of the semiconductor device 200 using the temperature information acquired by the thermistor 244. Namely, the driving of the gate through the first diode 41 and second diode 42 is performed selectively only when the semiconductor device 200 is at high temperature. Thus unnecessary drop of power conversion efficiency can be avoided.

The thermistor 244 may be provided adjacent the second semiconductor chip 20 so that it can detect the temperature of the second semiconductor chip 20, for example. The position of the thermistor 244 is not limited to this example.

Third Embodiment

Figure 8:
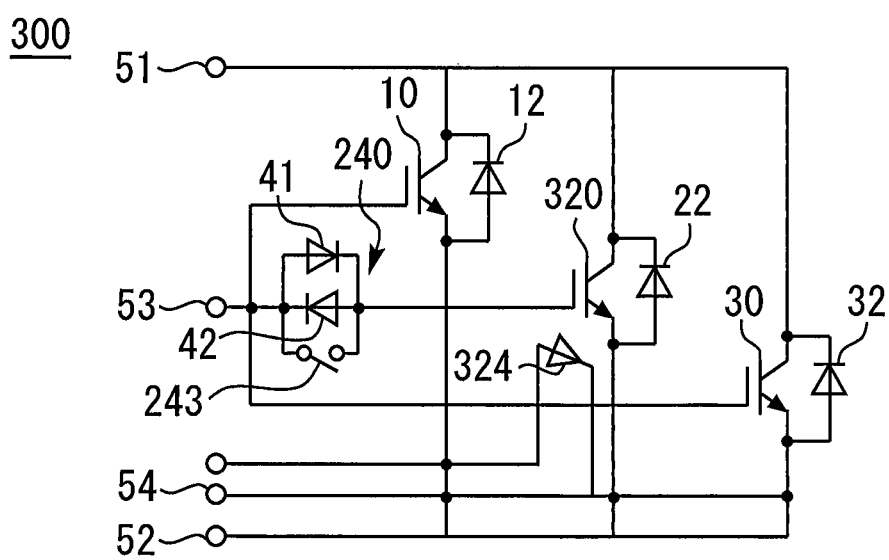
FIG. 8 is a circuit diagram of a semiconductor device according to a third embodiment.

FIG. 8 is a circuit diagram of a semiconductor device 300 according to a third embodiment. The second semiconductor chip 320 in this semiconductor device 300 includes a temperature sensor 324. The switch 243 turns off when the temperature detected by the temperature sensor 324 exceeds a predetermined value.

Similarly to the second embodiment, when the semiconductor device 300 is at a low temperature and the switch 243 is the on state, the first diode 41 and second diode 42 are bypassed by the switch 243. The switch 243 turns off when the temperature detected by the temperature sensor 324 exceeds a predetermined value. When the switch 243 is the off state, the gate of the second semiconductor chip 320 is driven through the first diode 41 and second diode 42. Therefore, similar effects to those of the first embodiment are achieved.

In this embodiment, the switch 243 is turned on and off based on the temperature of the second semiconductor chip 320 that has the highest junction temperature, using the temperature information acquired by the temperature sensor 324. Namely, the driving of the gate through the first diode 41 and second diode 42 is performed selectively only when the second semiconductor chip 320 is at high temperature. Thus unnecessary drop of power conversion efficiency can be avoided.

Moreover, in this embodiment, the switch 243 is turned on and off using the temperature information of the semiconductor chip itself. Therefore, the timing of turning on and off the switch 243 can be set more accurately than the second embodiment. The switch 243 may be turned off when the difference between the junction temperature of the second semiconductor chip 320 and the maximum rated junction temperature of the semiconductor device 300 falls below a predetermined value.

Fourth Embodiment

Figure 9:
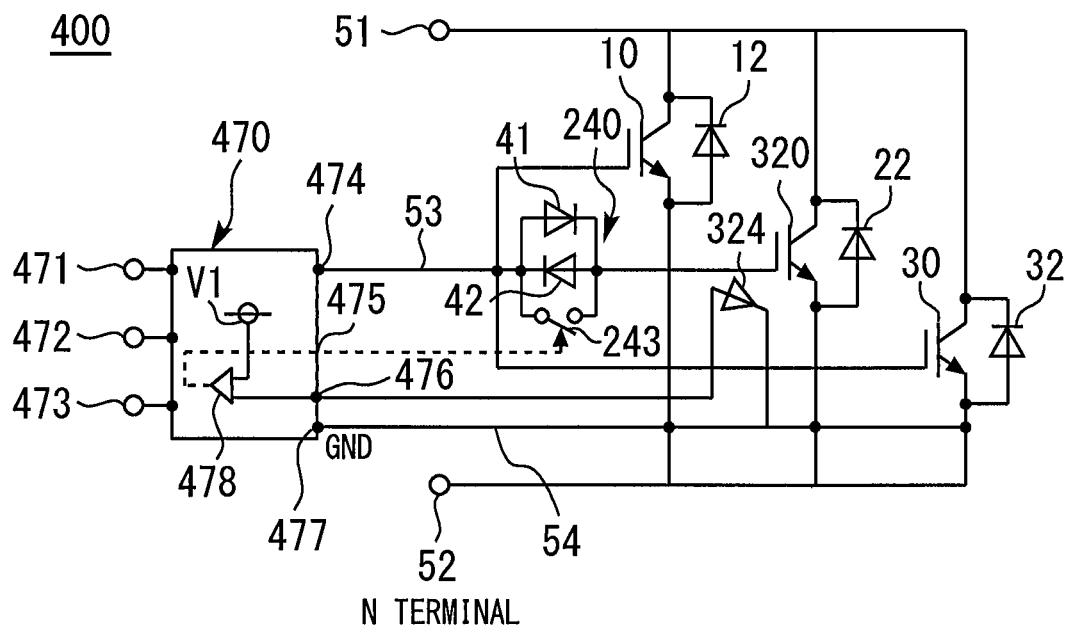
FIG. 9 is a circuit diagram of a semiconductor device according to a fourth embodiment.

FIG. 9 is a circuit diagram of a semiconductor device 400 according to a fourth embodiment. The semiconductor device 400 differs from the third embodiment in that it includes a control circuit 470. The control circuit 470 outputs gate voltage to the first to third semiconductor chips 10, 320, and 30, to switch over the first to third semiconductor chips 10, 320, and 30. The control circuit 470 also turns on and off the switch 243.

The control circuit 470 includes a power supply terminal 471 and a terminal for ground 473. The control circuit 470 operates with the voltage supplied to the power supply terminal 471. The control circuit 470 includes a gate control signal terminal 472. The control circuit 470 includes a gate voltage output terminal 474 connected to the gate terminal 53. The control circuit 470 outputs signals from the gate voltage output terminal 474 in accordance with the signal input to the gate control signal terminal 472 to switch over the first to third semiconductor chips 10, 320, and 30.

The control circuit 470 further includes an on/off control signal terminal 475, a sensing voltage input terminal 476, and a terminal for ground 477. One end of the temperature sensor 324 is connected to the sensing voltage input terminal 476, while the other end is connected to the Es terminal 54. The Es terminal 54 is connected to the terminal for ground 477.

The control circuit 470 includes a comparator 478. The sensing voltage of the temperature sensor 324 is input to a first input terminal of the comparator 478 via the sensing voltage input terminal 476. A reference potential V1 is input to a second input terminal of the comparator 478. The output terminal of the comparator 478 is connected to the on/off control signal terminal 475. The comparator 478 turns on and off the switch 243 via the on/off control signal terminal 475 based on a comparison between the sensing voltage of the temperature sensor 324 and the reference potential V1.

Figure 10:
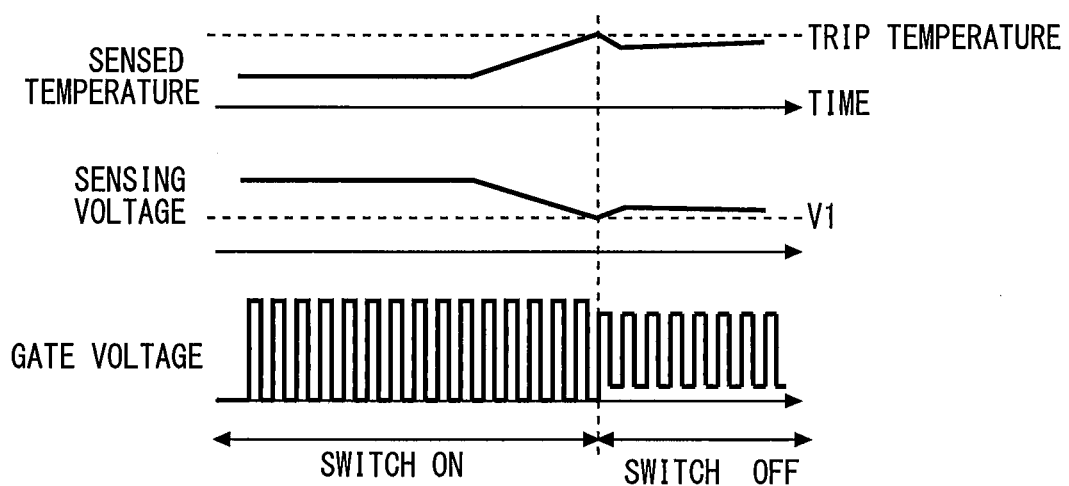
FIG. 10 is a timing chart showing the operation of the semiconductor device according to the fourth embodiment.

FIG. 10 is a timing chart showing the operation of the semiconductor device 400 according to the fourth embodiment. Initially, the switch 243 is on. Namely, the first to third semiconductor chips 10, 320, and 30 are driven with the same gate voltage. When the junction temperature of the second semiconductor chip 320 rises with the operation of the semiconductor device 400, the sensed temperature of the temperature sensor 324 increases. Concurrently, the sensing voltage of the temperature sensor 324 decreases.

When the junction temperature of the second semiconductor chip 320 exceeds a predetermined trip temperature, the sensing voltage of the temperature sensor 324 falls below the predetermined reference potential V1. The output voltage of the comparator 478 is thus inverted, whereby the switch 243 turns from the on state to the off state. Accordingly, the gate voltage of the second semiconductor chip 320 is reduced.

Namely, the control circuit 470 turns on the switch 243 when the temperature detected by the temperature sensor 324 is lower than the predetermined value. The control circuit 470 turns off the switch 243 when the temperature detected by the temperature sensor 324 exceeds the predetermined value. Thus the semiconductor device 400 performs autonomous control of the switch 243 based on the temperature information acquired by the temperature sensor 324 of the second semiconductor chip 320.

In this embodiment, the plurality of semiconductor chips and the switch 243 can be controlled automatically inside the semiconductor device 400. Therefore, no special control circuit need to be provided outside the semiconductor device 400 to control the plurality of semiconductor chips and switch 243. Thus the external circuit can be simplified.

In a variation example of this embodiment, a control circuit that controls the switch 243 and a control circuit that drives the plurality of semiconductor chips may be separately provided.

Meanwhile, technical features explained in the above embodiments may be appropriately combined to use.

In the semiconductor device according to the present invention, a diode is connected between a second semiconductor chip and a gate pattern, the second semiconductor chip being the one that tends to become hot among a plurality of semiconductor chips during the switching. The collector current flowing through the second semiconductor chip is reduced by a voltage drop achieved by the diode. Thus the temperature rise of the second semiconductor chip is suppressed and the temperature difference among the semiconductor chips can be reduced.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2018-238705, filed on Dec. 20, 2018 including specification, claims, drawings and summary, on which the Convention priority of the present application is based, are incorporated herein by reference in its entirety.

The invention claimed is:

1. A semiconductor device, comprising:
    a first semiconductor chip;
    a second semiconductor chip, the junction temperature of which becomes higher than that of the first semiconductor chip during switching of the semiconductor device;
    a collector pattern electrically connected to a collector of the first semiconductor chip and a collector of the second semiconductor chip;
    an emitter pattern electrically connected to an emitter of the first semiconductor chip and an emitter of the second semiconductor chip;
    a gate pattern electrically connected to a gate of the first semiconductor chip;
    a first diode having an anode electrically connected to the gate pattern and a cathode electrically connected to a gate of the second semiconductor chip; and
    a second diode connected in reverse parallel with the first diode.

2. The semiconductor device according to claim 1, further comprising a third semiconductor chip having a collector electrically connected to the collector pattern, an emitter electrically connected to the emitter pattern, and a gate electrically connected to the gate pattern, wherein
    the second semiconductor chip is provided between the first semiconductor chip and the third semiconductor chip.

3. The semiconductor device according to claim 1, wherein no resistor is connected between the anode and the cathode of the first diode.

4. The semiconductor device according to claim 1, wherein no switching device is connected between the first diode and the second semiconductor chip and between the first diode and the gate pattern.

5. The semiconductor device according to claim 1, wherein the first diode and the second diode are provided on the gate pattern.

6. The semiconductor device according to claim 1, further comprising a switch connected in parallel with the first diode and the second diode.

7. The semiconductor device according to claim 6, further comprising a thermistor, wherein
the switch turns off when the thermistor detects a temperature higher than a predetermined value.

8. The semiconductor device according to claim 6, wherein the second semiconductor chip includes a temperature sensor, and
the switch turns off when the temperature sensor detects a temperature higher than a predetermined value.

9. The semiconductor device according to claim 6, further comprising a control circuit, wherein
the second semiconductor chip includes a temperature sensor, and
the control circuit turns off the switch when the temperature sensor detects a temperature higher than a predetermined value.

10. A semiconductor device comprising:
a first semiconductor chip;
a second semiconductor chip;
a third semiconductor chip;
a collector pattern electrically connected to a collector of the first semiconductor chip, a collector of the second semiconductor chip, and a collector of the third semiconductor chip;
an emitter pattern electrically connected to an emitter of the first semiconductor chip, an emitter of the second semiconductor chip, and an emitter of the third semiconductor chip;
a gate pattern electrically connected to a gate of the first semiconductor chip and a gate of the third semiconductor chip;
a first diode having an anode electrically connected to the gate pattern and a cathode electrically connected to a gate of the second semiconductor chip; and
a second diode connected in reverse parallel with the first diode, wherein
the second semiconductor chip is provided between the first semiconductor chip and the third semiconductor chip.

11. The semiconductor device according to claim 10, wherein no resistor is connected between the anode and the cathode of the first diode.

12. The semiconductor device according to claim 10, wherein no switching device is connected between the first diode and the second semiconductor chip and between the first diode and the gate pattern.

13. The semiconductor device according to claim 10, wherein the first diode and the second diode are provided on the gate pattern.

14. The semiconductor device according to claim 10, further comprising a switch connected in parallel with the first diode and the second diode.

15. The semiconductor device according to claim 14, further comprising a thermistor, wherein
the switch turns off when the thermistor detects a temperature higher than a predetermined value.

16. The semiconductor device according to claim 14, wherein the second semiconductor chip includes a temperature sensor, and
the switch turns off when the temperature sensor detects a temperature higher than a predetermined value.

17. The semiconductor device according to claim 14, further comprising a control circuit, wherein
the second semiconductor chip includes a temperature sensor, and
the control circuit turns off the switch when the temperature sensor detects a temperature higher than a predetermined value.

* * * * *